(12) United States Patent
Steer

(10) Patent No.: US 11,688,957 B2
(45) Date of Patent: Jun. 27, 2023

(54) INTEGRATED CONNECTOR PORT MODULE

(71) Applicants: Matthew Steer, Sudbury (CA); Wilfred Steer, Sudbury (CA)

(72) Inventor: Matthew Steer, Sudbury (CA)

(73) Assignees: Matthew Steer, Sudbury (CA); Wilfred Steer, Sudbury (CA)

( * ) Notice: Subject to any disclaimer, the term of this patent is extended or adjusted under 35 U.S.C. 154(b) by 71 days.

(21) Appl. No.: 17/315,038

(22) Filed: May 7, 2021

(65) Prior Publication Data

US 2022/0359999 A1 Nov. 10, 2022

(51) Int. Cl.
| | |
|---|---|
| *H01R 12/58* | (2011.01) |
| *H01R 13/66* | (2006.01) |
| *H05K 1/11* | (2006.01) |
| *H01R 24/60* | (2011.01) |
| *H01R 13/40* | (2006.01) |

(52) U.S. Cl.
CPC ............ *H01R 12/58* (2013.01); *H01R 13/40* (2013.01); *H01R 13/665* (2013.01); *H01R 24/60* (2013.01); *H05K 1/117* (2013.01)

(58) Field of Classification Search
CPC .......... H01R 23/7068; H01R 23/7073; H01R 12/58; H01R 13/665; H01R 13/40; H01R 24/60; H05K 1/117
USPC .................................................. 439/79, 951
See application file for complete search history.

(56) References Cited

U.S. PATENT DOCUMENTS

| | | | | |
|---|---|---|---|---|
| 4,597,631 A | * | 7/1986 | Flores | G02B 6/389 385/59 |
| 5,319,523 A | * | 6/1994 | Ganthier | H05K 1/117 439/59 |
| 5,540,598 A | * | 7/1996 | Davis | H01R 12/724 439/79 |
| 5,744,759 A | * | 4/1998 | Ameen | H01R 12/79 361/767 |
| 6,162,091 A | * | 12/2000 | Kurotori | H01R 43/0256 439/571 |
| 6,341,988 B1 | * | 1/2002 | Zhu | H01R 12/721 439/79 |
| 8,308,515 B2 | * | 11/2012 | Chang | H01R 12/73 439/79 |
| 2015/0342062 A1 | * | 11/2015 | Jäger | H05K 1/09 174/257 |
| 2018/0166811 A1 | * | 6/2018 | Smith | H01R 12/721 |

* cited by examiner

*Primary Examiner* — Gary F Paumen

(57) ABSTRACT

A connector port module and a method of manufacturing the same. The connector port module includes a circuit board, with a connector having a plurality of connector pads formed on the circuit board configured to electrically connect to a mating connector. At least one via hole is formed in the circuit board for reinforcing the physical integrity and the heat diffusivity of the circuit board. The connector port module is capable of supporting Universal Serial Bus (USB) (e.g. USB-C) and Thunderbolt 3 connectors. The method includes: providing a circuit board; forming a plurality of connector pads on the circuit board configured to electrically connect to a mating connector; and forming at least one via hole for reinforcing physical integrity of the circuit board.

21 Claims, 4 Drawing Sheets

INTEGRATED CONNECTOR PORT MODULE

TECHNICAL FIELD

Example embodiments relate to electrical connector port modules, for example connector port modules that can support Universal Serial Bus (USB) standards.

BACKGROUND

The Universal Serial Bus (USB) communication standards have been widely adopted in the electronic devices industry. With the ever-increasing demand for power delivery and/or data transmission rate to and from electronic devices, the USB standard has also continually evolved to provide USB interfaces that meet the industry demand. Currently, common USB interfaces include the USB2.0™ for supporting up to 480 Mbps high-speed transmission rate, and the USB3.0™ for supporting up to 5 Gbps high-speed transmission rate, and Micro USB for supporting mobile applications.

The most recent of the USB standards is USB-C™, or USB 3.1 Type-C, standard as defined by the USB Implementers Forum (USB-IF) that was later adopted as the International Electrotechnical Commission (IEC) 62680-1-3 standard. USB-C has gained considerable industry adoption due to its ability to support up to 10 Gbps transmission rate, user friendly rotationally symmetrical connector, and the ability to provide complex functionality with up to 24 terminals. The transmission speed is further improved through the Thunderbolt 3 interface, using the same USB-C connectors.

However, the existing USB connectors (including USB-C connectors) can suffer from physical deterioration from repeated usage. More specifically, components such as the tongue portion of the female USB-C connector may deform or break. Further, USB-C connectors are known to suffer from heat diffusivity issues under high current loads, where the heat generated during operation is not adequately dispersed.

Accordingly, it would be useful to provide an improved connector port module that is capable of supporting USB-C connectors with improved physical integrity and heat diffusivity properties.

SUMMARY

Example embodiments relate to a connector port module and a method of manufacturing the same. The connector port module includes a circuit board, with a connector having a plurality of connector pads formed on the circuit board configured to electrically connect to a mating connector. At least one via hole is formed in the circuit board for reinforcing the physical integrity and the heat diffusivity of the circuit board. In an example embodiment the connector port module can support Universal Serial Bus (USB) standards.

In an example, the connector port module is an integrated connector port module. The method of manufacturing the integrated connector port module that can start from a circuit board and performing etching and plating on the circuit board. In an example, the method includes forming a plurality of connector pads on the circuit board and forming at least one via hole for reinforcing physical integrity of the circuit board.

An advantage of the method is that an additional USB port does not need to be soldered or attached to the circuit board.

An example embodiment is a connector port module, including: a circuit board; a connector having a plurality of connector pads formed on the circuit board configured to electrically connect to a mating connector; and at least one via hole formed in the circuit board for providing physical reinforcement to the circuit board.

An advantage of the connector port module is that the at least one via hole provides physical reinforcement to the circuit board, for example to improve resilience and increased lifetime from the continuous plugging and unplugging of the mating connector (e.g. USB mating connector or Thunderbolt 3).

An advantage of the connector port module is that the connector port module is convenient to manufacture as the additional connector port can be added to the manufacturing processor for existing circuit boards, reducing costs.

In an example embodiment of any of the above, the connector is a Universal Serial Bus (USB) connector.

An advantage of the connector port module is that the connector port module is compatible with USB standards.

In an example embodiment of any of the above, the USB connector is a USB-Type C (USB-C) connector, and the plurality of connector pads comprise 24 connector pads.

In an example embodiment of any of the above, the circuit board is an integrated printed circuit board (PCB).

In an example embodiment of any of the above, the circuit board includes a first portion, a second portion, and a rigid integrated connection joint in between the first portion and the second portion, wherein the plurality of connector pads are formed on the first portion of the circuit board, wherein the at least one via hole is formed at the rigid integrated connection joint.

In an example embodiment of any of the above, the at least one via hole includes a plurality of via holes, wherein the plurality of via holes run from the plurality of connector pads to the rigid integrated connection joint.

In an example embodiment of any of the above, the first portion is a tongue portion.

In an example embodiment of any of the above, the at least one via hole is coated with an electrically conductive material with tensile strength greater than that of the circuit board.

In an example embodiment of any of the above, the electrically conductive material is copper.

In an example embodiment of any of the above, the at least one via hole is gold plated.

In an example embodiment of any of the above, the at least one via hole is located in close proximity to a power pin of the plurality of connector pads such that the at least one via hole dissipates heat generated in the power pin.

In an example embodiment of any of the above, the second portion of the circuit board includes two arm portions flanking the first portion with a gap formed in between the arm portion and the first portion, the gap is dimensioned to receive an external connector.

In an example embodiment of any of the above, a sleeve that covers the first portion, the gap, and one of the two arm portions to improve structural integrity between the first portion and the second portion.

In an example embodiment of any of the above, outermost edges of the connector are plated in hard gold.

In an example embodiment of any of the above, a shell that provides passive or active shielding to the connector.

In an example embodiment of any of the above, the first portion is hourglass shaped with two mounting grooves.

In an example embodiment of any of the above, the at least one via hole is electrically isolated from other components of the connector port module.

Another example embodiment is a method of manufacturing a connector port module, including: providing a circuit board; forming a plurality of connector pads on the circuit board configured to electrically connect to a mating connector; and forming at least one via hole for reinforcing physical integrity of the circuit board.

In an example embodiment of any of the above, the forming of the at least one via hole further comprises forming the at least one via hole at a rigid integrated connection joint in between the first portion and the second portion of the circuit board.

In an example embodiment of any of the above, the forming of the at least one via hole includes forming a plurality of via holes and forming the plurality of via holes to run from the plurality of connector pads to the rigid integrated connection joint.

In an example embodiment of any of the above, the forming of the at least one via hole further comprises forming the at least one via hole without obstructing signal trace matching and electrically isolated from signal traces of the circuit board.

BRIEF DESCRIPTION OF THE DRAWINGS

Reference will now be made, by way of example, to the accompanying drawings which show example embodiments, and in which.

Similar reference numerals may have been used in different figures to denote similar components.

DETAILED DESCRIPTION

Example embodiments are made with reference to the accompanying drawings, in which embodiments are shown. However, many different embodiments may be used, and thus the description should not be construed as limited to the embodiments set forth herein. Rather, these embodiments are described so that the description of example embodiments will be thorough and complete. Like numbers refer to like elements throughout. Separate boxes or illustrated separation of functional elements or modules of illustrated systems and devices does not necessarily require physical separation of such functions or modules, as communication between such elements can occur by way of messaging, function calls, shared memory space, and so on, without any such physical separation. As such, functions or modules need not be implemented in physically or logically separated platforms, although they are illustrated separately for ease of explanation herein. Different devices can have different designs, such that while some devices implement some functions in fixed function hardware, other devices can implement such functions in a programmable processor with code obtained from a machine readable medium.

Figure 1A:
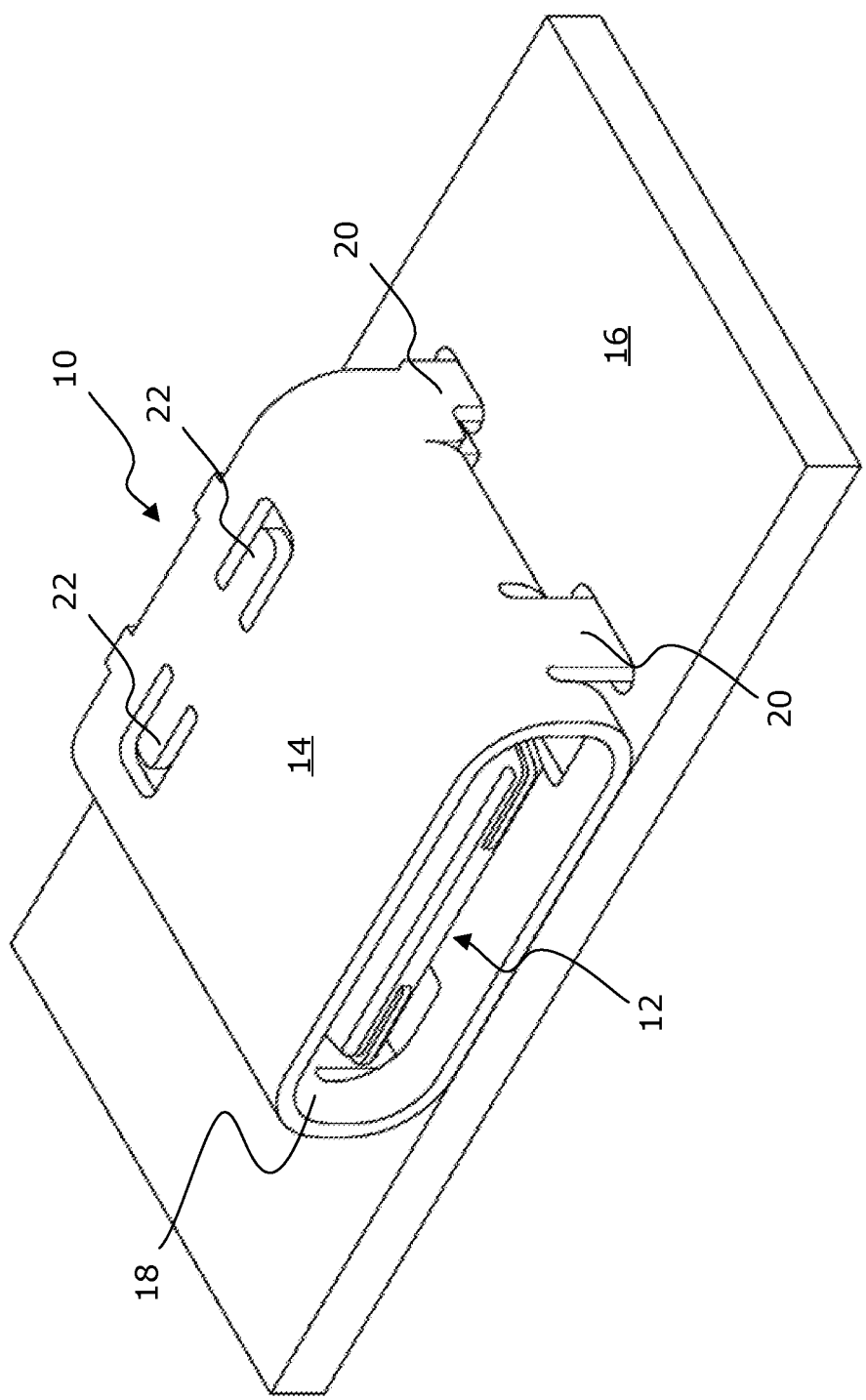
FIG. 1A illustrates an isometric view of a conventional USB-C soldered surface-mount connector.

Example embodiments include a connector port module that is capable of supporting USB-C and Thunderbolt 3 connectors with improved durability and heat diffusion properties. FIG. 1A illustrates an isometric view of a conventional USB-C soldered surface-mount connector port module 10. The connector port module 10 is configured to receive and couple to a corresponding connector that may be attached to a cable end (not shown here). The connector port module 10 includes a connector 12 encased in a shell 14. Typically, the connector port module 10 is electrically coupled on top of the base mounting plate (or the base plate 16)).

The shell 14 defines a front opening 18 exposing a portion of the connector 12. The front opening 18 is dimensioned to accommodate a mating connector (not shown). For a USB-C connector, the front opening 18 can be generally rectangular with rounded corners measuring approximately 8.4 mm by 2.6 mm. In FIG. 1A, the connector 12 is shown to be a female USB-C connector, and the front opening 18 is dimensioned to receive an external mating connector, such as a male USB-C connector (not shown). In other examples, the shell 14 could be for a male connector assembly configured to receive an external mating connector, such as a female USB-C connector (not shown).

The shell 14 is shown to include four (two of which are visible in FIG. 1A) mounting tabs 20 for coupling with base plate 16. The mounting tabs 20 can be inserted into mounting slots on the base plate 16 and soldered to form a conductive connection. Any other methods of mounting shell 14 onto the base plate 16, such as using electrically conductive adhesive, may also be used. The shell 14 further includes two resilient arms 22 for forming physical connections with other components or mounting to the casing of an electronic device. The shell 14 is dimensioned to sufficiently enclose the connector 12 therewithin.

The base plate 16 is a circuit board, such as a printed circuit board (PCB), that may have control logic comprised of a plurality of electronic components (not shown) mounted to one side (for example a top side on which the casing 104 is mounted) or both sides (the top side and a bottom side opposite of the top side). The electronic components on the base plate 16 are supported by the base plate 16 and can, for example, include control circuit components such as resistors, capacitors, transformers, capacitor modules, resistor modules, and transformer modules, and other active and passive components.

Figure 1B:
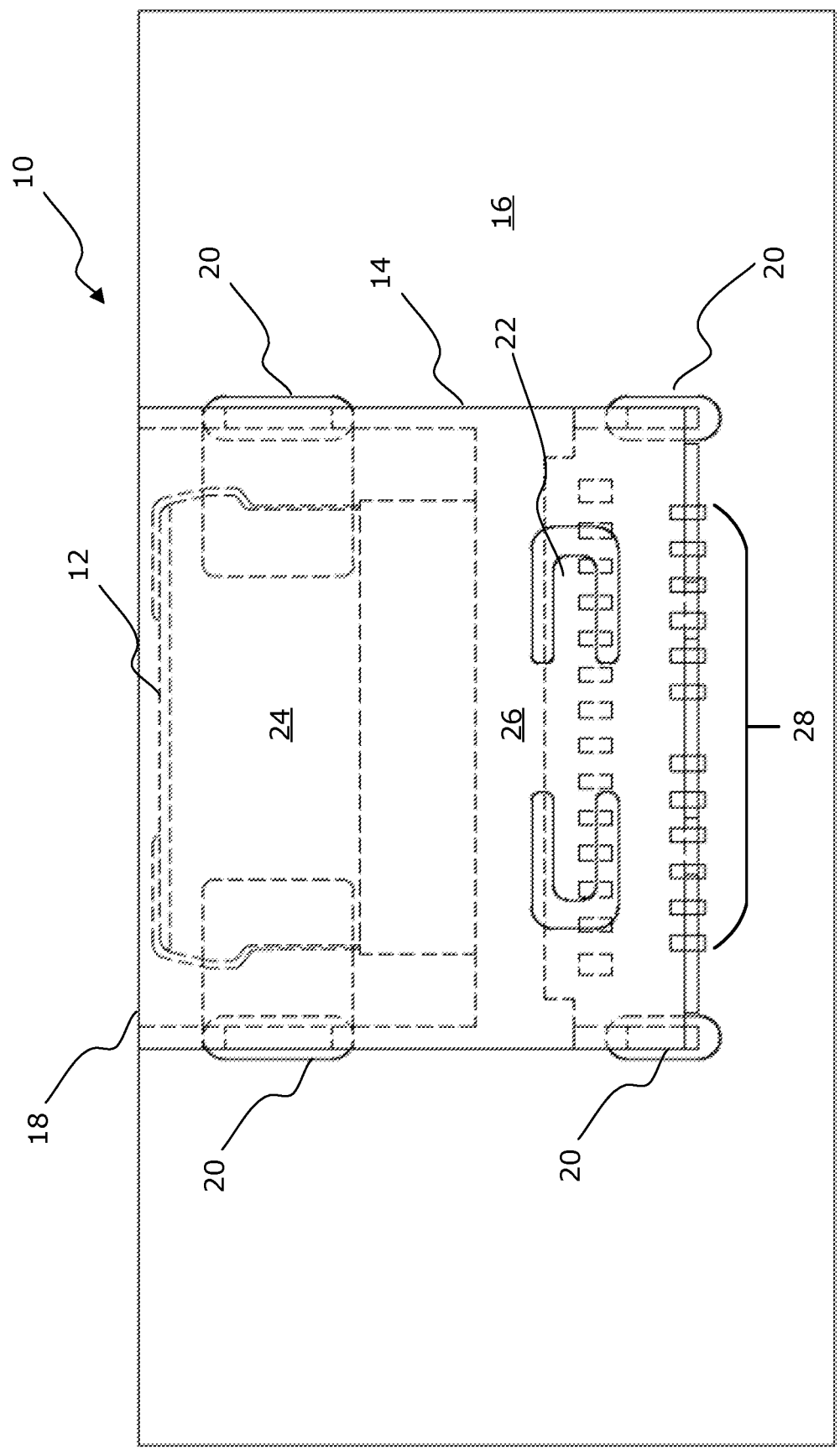
FIG. 1B illustrates a top assembly view of the connector in FIG. 1A.

FIG. 1B is a top assembly view of the connector port module 10 in FIG. 1A, which better illustrates the connector 12 within the shell 14. The connector 12 includes a mating fixture, in the case of FIG. 1B a tongue portion 24 is connected (e.g. by soldering) to a body portion 26 at a first end. A plurality of output terminal pins 29 are located near a second end, opposite of the first end, of the body portion 26. As shown, in the case of USB-C, there are 24 output terminal pins 28. There are two pairs of ground pins and two pairs of power pins (+V or Vbus). The data paths include four differential pairs that can be used for high-speed data transmission under specifications for USB-C. The number of output terminal pins 28 may vary depending on the type of connector and corresponding specification. For example, 9 output terminals pins for USB 3.0, and 4 output terminal pins for USB 2.0, etc. Each of the output terminal pins 28 can be electrically coupled to a signal trace on the base plate 16 for the transmission of data and/or power.

Figure 2A:
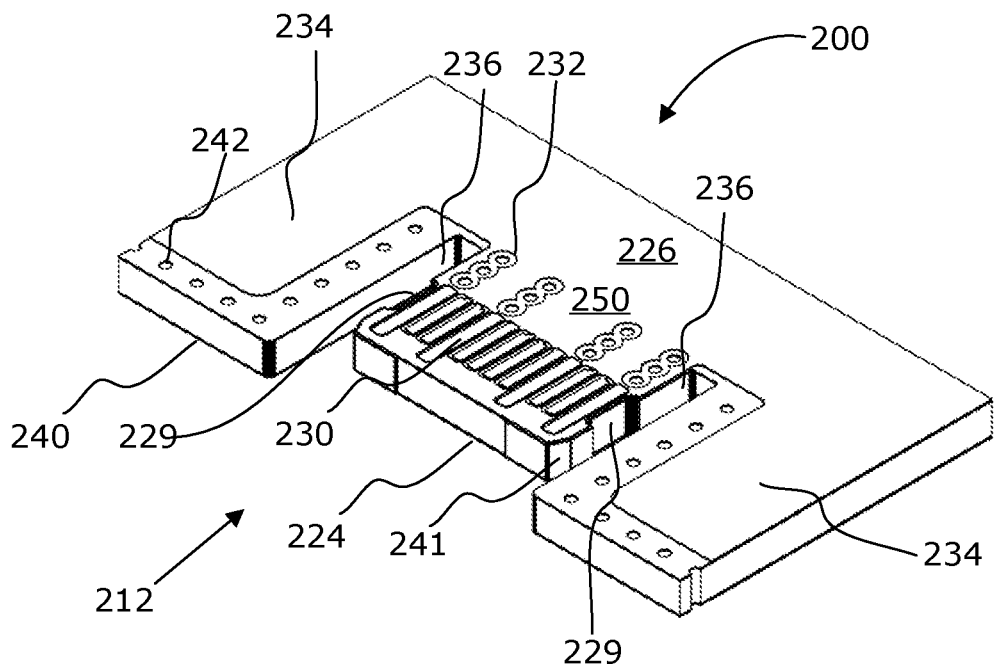
FIG. 2A illustrates a partial isometric view of a connector port module in accordance with an exemplary embodiment.
Figure 2B:
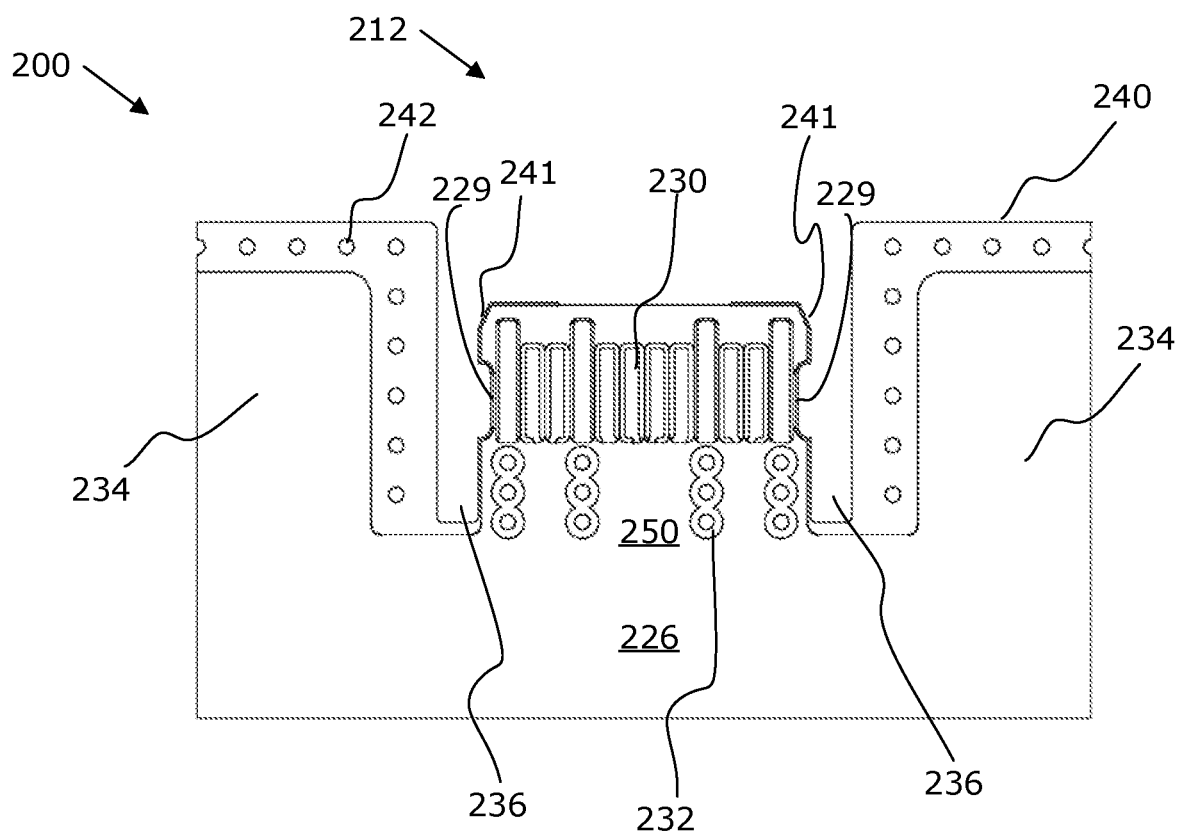
FIG. 2B illustrates a partial top view of the connector port module in FIG. 2A.

Reference is mow made to FIGS. 2A and 2B, which illustrate a partial isometric view and a partial top view of a connector port module 200 according to an exemplary embodiment, respectively. The embodiment shown in FIGS. 2A and 2B would serve as a complete replacement for the conventional USB-C port shown in FIGS. 1A and 1B. The connector port module 200 can be an integral piece of PCB having one or more layers. In example embodiments, the connector port module 200 can be part of (integrated with) another device such as a circuit board. The connector port module 200 includes a plurality of connector pads 230. Signals are routed from the connector pads 230 to the rest of the PCB through signal traces formed on one or more of the layers. When two or more PCB layers are used, the traces on different layers may be matched to ensure uniform signal propagation delay between layers. When multiple layers are used, one or more via holes may be formed to route signal to the inner layers. The PCB layer may include signal layer, ground layer (or ground plane), routing layer, mechanical layer, power layer (or power plane), solder mask layer, etc. One or more of the layers may be combined. Decision on number of layers may depend on design considerations including available PCB size, signal crosstalk, coupling, overshoot/undershoot, electromagnetic interference, and signal dissipation. A minimum of 4 layers are required in some examples, and the PCB thickness can be between 0.8 mm and 1.0 mm.

In the embodiment shown in FIGS. 2A and 2B, a tongue portion 224 is integrally formed with a body portion 226, which may provide improved physical integrity of the connector port module 200. The connector port module 200 includes a connector 212 for connecting to another device. A rigid integrated connection joint 250 integrally connects the tongue portion 224 to the body portion 226. In some embodiments as shown in FIGS. 2A and 2B, the tongue portion 224 is of an hourglass shape with a mating groove 229 (two shown) on a mid-section of each side of the tongue portion 224. The tongue portion 224 protrudes from the body portion 226. The mating grooves 229 are dimensioned to engage corresponding hourglass springs of a mating connector, such as a male USB-C connector (not shown), for a resilient physical connection. In some embodiments, the mating grooves 229 may be of trapezoidal shape with tapered sides to permit disengagement of the mating connector.

The plurality of connector pads 230 are aligned parallel to one another along a lengthwise direction of the tongue portion 224. Each connector pad 230 is configured to come in electrically conductive contact with a corresponding connector pad from a mating connector. Generally, the arrangement, number and physical dimensions of the connector pads 230 depend on the type of connector and particular application or implementation. In some embodiments where the connector 212 is a USB-C connector as shown in FIGS. 2A and 2B, there are 24 connector pads 230 symmetrically arranged with 12 pads formed on a first top surface of the tongue portion 224 as shown, and another 12 formed on a second bottom surface, opposing the first top surface (not shown). The symmetrical connector pad arrangement permits reversible connector placements, which eliminations the possibility and frustration that may be associated with incorrect connector orientation. In some embodiments, the connector pads 230 may be of different lengths as shown in FIGS. 2A and 2B. By way of a non-limiting example, connector pads 230 that are configured to contact power pins (i.e. +V pins) and ground pins (i.e. GND pins) of a USB-C connector may have increased length compared to rest of the connector pads 230 so that power may applied before signal connection. The connector pads 230 may be of any suitable conductive material, such as copper. In some embodiments, the connector pads 230 may be gold plated in order to further reduce the electrical resistance, and thus improve the electrical properties of the connector pads 230. Each of the connector pads 230 may be extended, via an intermediate layer of the body portion 226.

One or more via holes 232 are formed in the region between the tongue portion 224 and the body portion 226, which is part of the body portion 226 that is most prone to physical damage such as where the tongue portion 224 may bend, deform, or break from the body portion 226. As illustrated in FIGS. 2A and 2B, in an example, there are a plurality of via holes 232. The via holes 232 provide reinforcement against bending and breaking. Each via hole 232 extends from the top surface of the body portion 226 through to the bottom surface. In an example, there are a number of sets of via holes 232, and each set of via holes 232 run from the connector pads 230 to the rigid integrated connection joint 250. In an example, as shown in FIGS. 2A and 2B, the sets of via holes 232 are arranged in parallel rows. A ground layer of the connector PCB is electrically coupled to all of the via holes 232. The interior surface of the via hole 232 may be coated with a metallic material that is electrically conductive and has a greater tensile strength than that of the connector 212. By way of a non-limiting example, the via holes 232 may be coated with copper, and in some embodiments further gold plated. A circumferential ring formed of a conductive material, such as copper or gold, may be formed on the surface of the body portion 226 around each via hole 232 to provide an enlarged conductive area for forming electrical connection with each via hole 232, such as through soldering. In some embodiments as shown in FIGS. 2A and 2B, the via holes 232 are conductively coupled to one another by overlapping the conductive rings of the via holes 232. Alternatively in some further embodiments, the via holes 232 may be conductively isolated from each other and other components of the connector port module, including the connector pads 230, as well as the signal traces. As well, the via holes 232 do not receive any wires or leads.

Due to its metallic composition, each via hole 232 has improved flexural strength compared to the material of the body portion 226, such as laminated composite made from non-conductive substrate materials of a PCB board. In some embodiments as shown in the figures, multiple via holes 232 may be placed along the lengthwise direction of the tongue portion 224 to reinforce a larger area of the tongue portion 224.

In some embodiments, the via holes 232 may be evenly spread out along a width-wise direction of the tongue portion 224. In some further embodiments, the via holes 232 may be aligned with the power and ground connector pads as shown in FIGS. 2A and 2B so that the signal traces may be routed unhindered from the connector pads 230 to the rest of the PCB. In such embodiments, the diameter of the via holes are similar to the width of the connector pads 230 (including the power/ground pads) so as to avoid causing routing issues for the signal traces. The power and ground pads, which may carry power up to 20 volts (V) and 5 amperes (A), generate considerable heat during operation. By being placed in close proximity to the connector pads 230, the via holes 232 may also provide improved heat diffusivity. Each via hole 232 may divert heat away from the power/ground pads and thereby improve the operational temperature of the device.

The body portion 226 includes two arm portions 234 flanking the tongue portion 224 located in between. A gap 236 is formed between each arm portion 234 and the tongue portion 224 for receiving an outer casing of the mating connector. In an example, the total width of the two gaps 236 and the tongue portion 224 approximately equals to the side of the front opening of the connector port module 200 where the plug is received. When assembled, the two arm portions 234 are located inside of the casing on either side of the front opening of the connector port module 200.

As shown in FIGS. 2A and 2B, a hard-gold plating 240 is applied to the gap 236 to cover portions of tongue portion 224 and an arm portion 234. In an example, this plating 240 is typically around 2.6 microns thick. In an example, the hard-gold plating 240 is a type of electroplated gold that is alloyed with another metal (e.g. cobalt, nickel or iron) to make the gold stronger and more abrasion resistant. In some embodiments, the plating 240 is a solid metallic piece that is able to further reinforce the structural strength of the connector port module 200. As well, the plating 240 offers an electrically conductive shielding path that can be left as a passive in an example, as well as connected to an active shielding logic circuit in another example.

Figure 3:
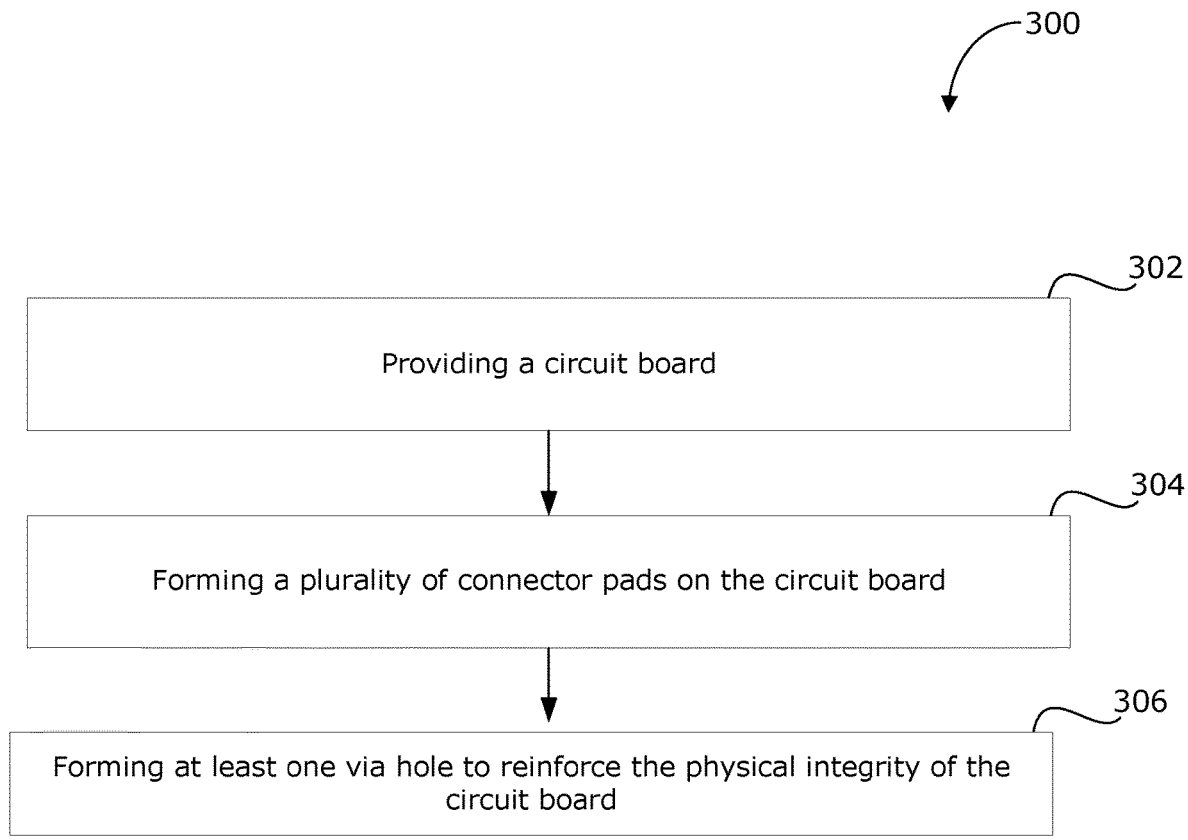
FIG. 3 illustrates a flowchart of a method 300 for manufacturing a connector port module.

FIG. 3 illustrates a flowchart of a method 300 for manufacturing a connector port module in accordance with an example embodiment. At step 302, there is provided a circuit board. The circuit board may be a PCB having one or more plurality of layers configured for laying signal signals that may conduct power, ground, and electrical signals from one part of the circuit board to another. The circuit board includes a tongue portion integrally formed with a body portion. A rigid integrated connection joint integrally connects the tongue portion to the body portion.

At step 304, a plurality of connector pads are formed on the circuit board. The connector pads may be formed through any suitable etching and plating process. Each of the connector pads are electrically coupled to one or more layers of the circuit board where signal traces may suitably direct the signal received from each connector pad to another location along the board, such as output terminal pins or logic components as needed. The plurality of connector pads can be formed on the tongue portion.

At step 306, reinforcing the physical integrity of the circuit board by forming at least one via hole on the circuit board. The via holes may be any of the through-hole, blind, buried, or microvia types. The via holes may be formed by drilling, such as by laser drilling, holes through or partially through the circuit board. The via holes are then made electrically conductive through electroplating or anything suitable method. The electrically conductive material used to electroplate the via holes provides the added flexural strength to the circuit board. In some embodiments, the via holes may be further enhanced by tenting, plugging, or filling to improve thermal conductivity or to improve their assembly yields. In some embodiments, the at least one via hole may be provided at the rigid integrated connection joint of the circuit board.

In some embodiments, the circuit board may be encased in a shell. The shell may be grounded to provide shielding for the circuit board. The shell may be formed with tabs for mounting with a base plate, which may comprise of one or more circuit logic components. In an example, the shell is the same or similar to the shell 14 illustrated in FIGS. 1A and 1B.

In some embodiments, the via holes may be formed in close proximity to some of the connector pads, such as the power pins, so as to be able to conduct heat away from the connector pads and more evenly distribute the heat, through signal traces, to other parts of the board to be dissipated. In some embodiments, the via holes are formed such that they do not interfere with the routing of the signal traces in an intermediate layer of the circuit board to minimize the matching efforts of the signal traces. In some embodiments, the via holes are formed such that they are conductively isolated from one another as well as the signal traces of the circuit board.

In an example, the connector port module 200 is part of a circuit board for a mobile communication device such as a mobile phone, tablet, or laptop. The circuit board of the mobile communication device can be manufacture to have data communication and telephony functions, antennas, battery control, components, and other features. For example, the circuit board of the mobile communication device can include the connector port module 200 integrated with the circuit board, using the method 300. For example, the circuit board can be integrated with a USB port using the method 300. Accordingly, the circuit board does not require attaching additional components or USB ports in order to have incorporate the USB port. An advantage is that less cost, processing and materials are required because the integrated USB port can be formed in a circuit board rather than soldering a USB port to the circuit board.

Although example embodiments are described as methods and processes with steps in a certain order, one or more steps of the methods and processes may be omitted or altered as appropriate. One or more steps may take place in an order other than that in which they are described, as appropriate.

Although example embodiments are described, at least in part, in terms of methods, a person of ordinary skill in the art will understand that example embodiments are also directed to the various components for performing at least some of the features of the described methods, be it by way of hardware components, software or any combination of the two. Accordingly, the technical solution of example embodiments may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processor device (e.g., a personal computer, a server, or a network device) to execute examples of the methods disclosed herein.

The example embodiments may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of example embodiments.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover all suitable changes in technology, such as future versions of the USB standard.

The invention claimed is:

1. A connector port module, comprising:
a circuit board including a first portion, a second portion, and a rigid integrated connection joint in between the first portion and the second portion;
a connector having a plurality of connector pads formed on the circuit board configured to electrically connect to a mating connector, wherein the plurality of connector pads are formed on the first portion of the circuit board; and
a plurality of via holes formed in the circuit board for providing physical reinforcement to the circuit board,
wherein at least one of the via holes is formed at the rigid integrated connection joint,
wherein at least some of the plurality of via holes run from the plurality of connector pads to the rigid integrated connection joint.

2. The connector port module of claim 1, wherein the connector is a Universal Serial Bus (USB) connector.

3. The connector port module of claim 2, wherein the USB connector is a USB-Type C (USB-C) connector, and the plurality of connector pads comprise 24 connector pads.

4. The connector port module of claim 1, wherein the circuit board is an integrated printed circuit board (PCB).

5. The connector port module of claim 1, wherein the first portion is a tongue portion.

6. The connector port module of claim 1, wherein the plurality of via holes are coated with an electrically conductive material with tensile strength greater than that of the circuit board.

7. The connector port module of claim 6, wherein the electrically conductive material is copper.

8. The connector port module of claim 1, wherein the plurality of via holes are gold plated.

9. The connector port module of claim 1, wherein at least one of the via holes is located in close proximity to a power pin of the plurality of connector pads to dissipate heat generated in the power pin.

10. The connector port module of claim 1, wherein the second portion of the circuit board includes two arm portions flanking the first portion with a gap formed in between the arm portion and the first portion, the gap is dimensioned to receive an external connector.

11. The connector port module of claim 10, further comprising a sleeve that covers the first portion, the gap, and one of the two arm portions to improve structural integrity between the first portion and the second portion.

12. The connector port module of claim 11, wherein outermost edges of the connector are plated in hard gold.

13. The connector port module of claim 1, further comprising a shell that provides passive or active shielding to the connector.

14. The connector port module of claim 1, wherein the first portion is hourglass shaped with two mounting grooves.

15. The connector port module of claim 1, wherein the plurality of via holes are electrically isolated from signal traces or other components of the connector port module.

16. The connector port module of claim 1, wherein the at least one of the via holes formed at the rigid integrated connection joint comprises at least two of the via holes.

17. A method of manufacturing a connector port module, comprising:
providing a circuit board having a first portion, a second portion, and a rigid integrated connection joint in between the first portion and the second portion;
forming a plurality of connector pads on the first portion of the circuit board configured to electrically connect to a mating connector; and
forming a plurality of via holes for reinforcing physical integrity of the circuit board, comprising:
forming at least one of the via holes at the rigid integrated connection joint, and
forming at least some of the plurality of via holes to run from the plurality of connector pads to the rigid integrated connection joint.

18. The method of claim 17, wherein the forming of the plurality of via holes are formed without obstructing signal trace matching and are electrically isolated from signal traces of the circuit board.

19. A connector port module, comprising:
a circuit board including a first portion that is hourglass shaped with two mounting grooves, a second portion, and a rigid integrated connection joint in between the first portion and the second portion;
a connector having a plurality of connector pads formed on the circuit board configured to electrically connect to a mating connector, wherein the plurality of connector pads are formed on the first portion of the circuit board; and
at least one via hole formed at the rigid integrated connection joint in the circuit board for providing physical reinforcement to the circuit board.

20. The connector port module of claim 19, wherein the at least one via hole formed at the rigid integrated connection joint comprises at least two via holes.

21. A method of manufacturing a connector port module, comprising:
providing a circuit board having a first portion that is hourglass shaped with two mounting grooves, a second portion, and a rigid integrated connection joint in between the first portion and the second portion;
forming a plurality of connector pads on the first portion of the circuit board configured to electrically connect to a mating connector; and
forming at least one via hole at the rigid integrated connection joint in the circuit board for reinforcing physical integrity of the circuit board.

* * * * *